(12) United States Patent
Stoddard

(10) Patent No.: US 9,506,165 B2
(45) Date of Patent: Nov. 29, 2016

(54) METHOD FOR PRODUCING SILICON-INGOTS

(71) Applicant: SolarWorld Industries America Inc., Hillsboro, OR (US)

(72) Inventor: Nathan Stoddard, Beaverton, OR (US)

(73) Assignee: SolarWorld Americas Inc., Hillsboro, OR (US)

( * ) Notice: Subject to any disclaimer, the term of this patent is extended or adjusted under 35 U.S.C. 154(b) by 198 days.

(21) Appl. No.: 14/058,708

(22) Filed: Oct. 21, 2013

(65) Prior Publication Data

US 2015/0111020 A1    Apr. 23, 2015

(51) Int. Cl.
*C30B 11/02* (2006.01)
*C30B 11/14* (2006.01)
*C30B 29/06* (2006.01)

(52) U.S. Cl.
CPC ............... *C30B 11/14* (2013.01); *C30B 29/06* (2013.01)

(58) Field of Classification Search
CPC ...... C30B 11/006; C30B 11/02; C30B 11/14
See application file for complete search history.

(56) References Cited

U.S. PATENT DOCUMENTS 8,440,157 B2 * 5/2013 Stoddard .............. C30B 11/003
423/349
2011/0297223 A1    12/2011 Krause et al.

FOREIGN PATENT DOCUMENTS

DE    10 2010 029741 A1    12/2011

* cited by examiner

*Primary Examiner* — Robert M Kunemund
(74) *Attorney, Agent, or Firm* — McGlew and Tuttle, P.C.

(57) ABSTRACT

Method for producing silicon-ingots (1) comprising the following steps: Providing a silicon melt (3), growing a block (2) of silicon from said silicon melt (3), said block (2) having a predetermined crystal orientation, cutting said block (2) along at least one cutting plane (16, 17, 18) into a number of silicon-ingots (1).

20 Claims, 15 Drawing Sheets

METHOD FOR PRODUCING SILICON-INGOTS

FIELD OF THE INVENTION

The invention relates to a method for producing silicon-ingots. The invention further relates to silicon blocks.

BACKGROUND OF THE INVENTION

In order to increase the efficiency of a process for producing silicon-ingots it would be advantageous to grow a larger number of ingots in parallel. However, growing larger ingots is commonly associated with a higher spread of dislocations and thus, with a larger dislocation density.

SUMMARY OF INVENTION

It is an object of the invention to improve a method for producing silicon-ingots.

This object is solved by a method comprising the following steps: Providing a silicon melt, growing a block of silicon from said silicon melt, said block having a predetermined crystal orientation, and cutting said block along at least one cutting plane into a number of silicon-ingots.

It was found, that the spread of dislocations when growing a block of silicon from a silicon melt is highly depended on the choice of the crystal orientation of said block. Thus, by choosing a particular predetermined crystal orientation a block of silicon can be grown, which has a constant dislocation density along its growth direction, which in the following will also be denoted as longitudinal direction.

It was further realized, that by cutting said block along particular cutting planes silicon-ingots with a predetermined crystal structure, in particular silicon-ingots with a given crystal orientation along their longitudinal axis can be produced.

Thus, it was possible to increase the throughput of a method for producing silicon-ingots, in particular for the production of solar cells, by more than 50%.

According to an aspect of the invention for the growing of said silicon block a directional solidification process is used. In particular, the block of silicon can be grown by a Bridgman process, a vertical gradient freeze process or a crucible-less process. An example of the latter is provided in U.S. Ser. No. 13/561,350, which is herewith incorporated by reference in its entirety.

According to another aspect of the invention for the growing of said block of silicon the growth direction is chosen to be parallel to one of the following directions <100>, <110> and <111>.

It was found, that by choosing a particular growth direction dislocations propagate vertically in the growing crystal and do not multiply or spread. Thus, silicon blocks with a constant density of dislocations along their entire growth direction can be grown. In particular, it is possible to grow silicon blocks with a height in growth direction of more than 30 cm, in particular at least 40 cm, in particular at least 48 cm, wherein these silicon blocks are quasi void of dislocations, i. e. dislocation free. The dislocation density of these blocks is in particular less than $10^{-4}$ cm$^{-2}$, in particular less than $10^{-3}$ cm$^{-2}$.

According to another aspect of the invention for the growing of such silicon block a seed assembly is used. The seed assembly comprises at least one seed, in particular at least one seed crystal. In can comprise a plurality of seeds. The seeds can be placed next to each other. They can form a seed layer. They can in particular be arranged to form a tiling of such a layer. Preferably, the seeds have a given crystal orientation. The crystal orientation of the seeds is in particular chosen to be the same as the desired orientation of the growth direction. The seeds can in particular have an upper surface with a surface normal parallel to one of the following directions: <100>, <110> and <111>.

The seeds can be made from monocrystalline silicon, in particular from Czochralski grown silicon. They can in particular be cut from a Czochralski boule, in particular with a diameter of at least 200 mm, in particular at least 400 mm, in particular at least 450 mm.

Seeds made from monocrystalline silicon lead to silicon blocks with a particularly advantageous structure. They can in particular lead to silicon blocks, which are almost void of dislocations. In particular, with monocrystalline seeds it is possible to grow monocrystalline or quasi monocrystalline silicon blocks.

The seeds can be cut from Czochralski-ingots, in particular by cutting such ingots along planes which are oriented parallel to the longitudinal direction of such ingot.

According to an aspect of the invention said block has a length in a growth-direction of at least 320 mm, in particular at least 470 mm. The length of the block in growth-direction can correspond to an integer multiple of 156 mm or an alternative measure, which corresponds to the side length of wafers, which shall be cut from the silicon-ingots produced according to the present method.

According to another aspect of the invention said block has a rectangular cross section. A block can in particular have a square cross section. The block has in particular a cross section which one side corresponding to an integer multiple of a side length of a wafer to be cut, in particular an integer multiple of 156 mm. The other side length of the cross section is in particular chosen according to the dimensions of a wire saw which is used for the cutting step. The other side length can be in particular around 500 mm.

According to another aspect of the invention said block has a crystal-structure and side faces the normals of which are oriented parallel to one of the following directions: <100>, <110> and <111>.

Such a crystal structure and orientation of said silicon block facilitates the production of silicon-ingots with a predetermined crystal-structure. In particular, it is possible to cut silicon-ingots with a longitudinal direction parallel to a <100>-orientation using solely vertical cuts. If needed, the block is turned over, i. e. rotated by 90° relative to a horizontal axis, prior to cutting.

According to another aspect of the invention the silicon-ingots have a square cross-section. The cross-section of the silicon-ingots corresponds in particular to the area, i. e. the cross-section of wafers to be cut from said ingots. The ingots can in particular have a square cross-section with a side length of 156 mm, 208 mm or 312 mm.

According to another aspect of the invention said block is cut such that said silicon-ingots have a longitudinal direction which is perpendicular to a growth direction of said block. The cutting can be performed by a wire saw. The block can in particular be cut along vertical cutting planes. For that cutting the block can be turned over, i. e. rotated with respect to a horizontal axis by 90°.

With that it is in particular possible to grow the silicon-block with a growth direction which is parallel to a first crystal orientation and cut the silicon-ingots, such that their longitudinal direction is parallel to a second crystal-orientation, wherein the second crystal-orientation is different from the first crystal-orientation. The second crystal-orientation can in particular be chosen to be one of the following directions: <100>-, <110>- and <111>-direction.

According to another aspect of the invention said block is cut into a matrix of silicon-ingots, wherein each side of the matrix corresponds to at least two silicon-ingots. The block can in particular be cut into a matrix of 2×2, 2×3, 2×4, 2×5, 2×6, 3×3, 3×4, 3×5, 3×6, 4×4, 4×5, 4×6, 5×5, 5×6 or 6×6 ingots. Different cutting schemes are in principle also possible.

Another object of the invention is to provide improved silicon blocks.

This object is solved by silicon blocks with a height of at least 400 mm and a cross sectional area of at least 320 mm×320 mm, wherein the silicon of the silicon blocks has an interstitial oxygen content of less than $5 \times 10^{16}$ atoms per $cm^3$. They can have a nitrogen content of less than $1 \times 10^{15}$ atoms per $cm^3$. This includes single nitrogen atoms, nitrogen dimers N—N and triplets out of two nitrogen atoms and one oxygen atom N—N—O.

Further details and advantages of the invention will be described with reference to specific embodiments shown in the figures.

Figure 1:
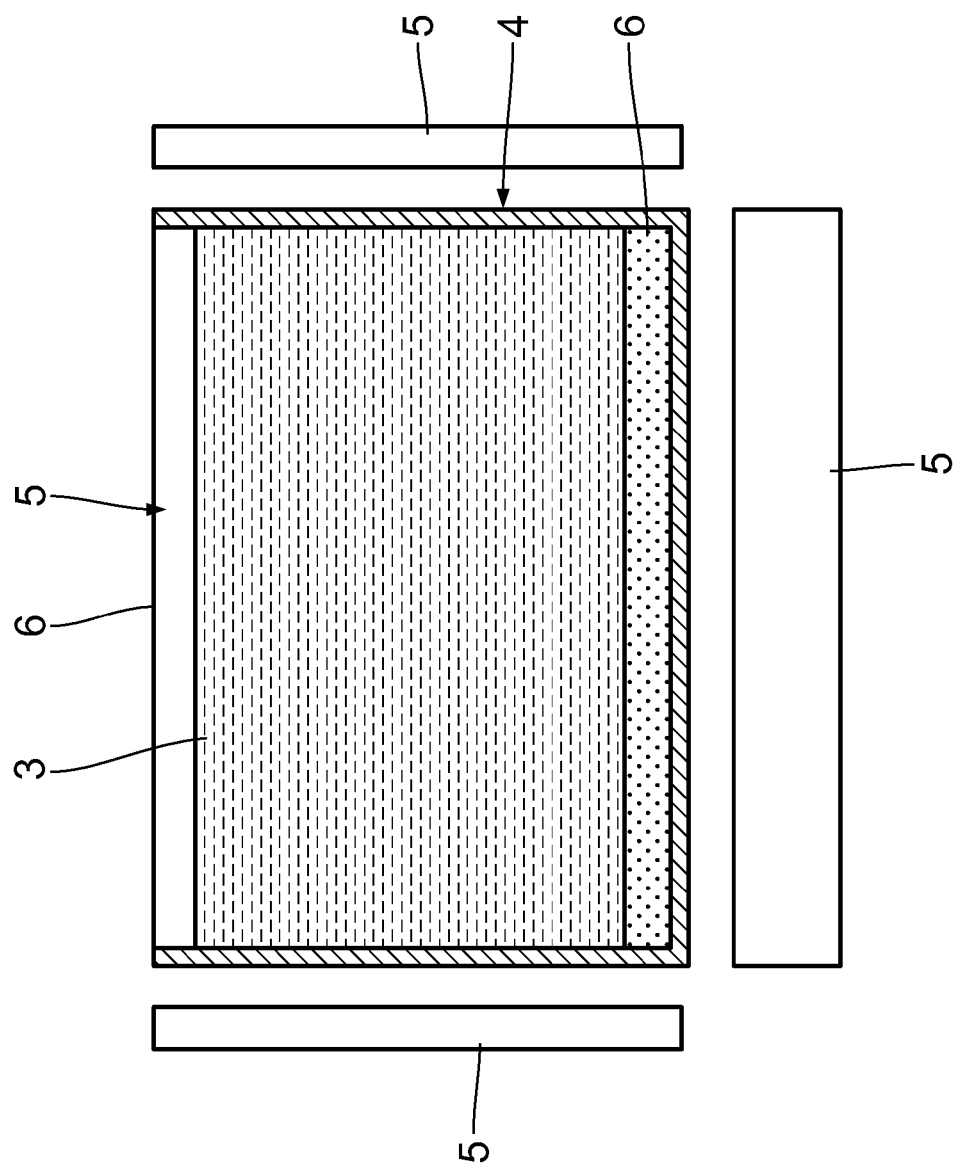
FIG. 1 shows a schematic view of an apparatus for the production of silicon blocks.

In the following a method for producing silicon ingots 1 is described. First a silicon block 2 is produced. The silicon block 2 can be grown from a silicon melt 3 in a crucible 4. The silicon block 2 can in particular be grown according to a Bridgman process or a vertical gradient freeze process. For that an apparatus schematically shown in FIG. 1 is used. The apparatus comprises a device for melting and crystallising silicon. Such device comprises the crucible 4 as well as a temperature control device with heating- and/or cooling elements 5. The crucible 4 can also be part of the device. The crucible 4 comprises an inside, which can be filled with silicon, either in form of solid silicon pieces or in form of already melted silicon. Thus, the silicon melt 3 can be provided in the inside of said crucible 4. At the bottom of the crucible 4 a seed assembly 6 is provided. The seed assembly will be described in more detail later.

The silicon melt 3 can be crystallised inside the crucible 4. Thus, the silicon block 2 can be produced.

For further details of the apparatus and method for the production of the silicon block 2 reference is made to DE 10 2013 200 079.0, which herewith is incorporated in its entirety into the present application. Further details of the apparatus and the method for the production of the silicon ingots can also be found in DE 10 2010 029 741 A1, which is also incorporated by reference.

Alternatively, the silicon block 2 can be produced by a crucible less method. It can in particular be produced according to the method described in U.S. Ser. No. 13/561, 350, which herewith is also incorporated in its entirety by reference into the present application.

The silicon block 2 has at least zones with a monocrystalline structure. It has in at least 50%, in particular at least 70%, in particular at least 90% of its volume a monocrystalline structure. Thus, it is also referred to as quasi monocrystalline silicon block 2.

Figure 2:
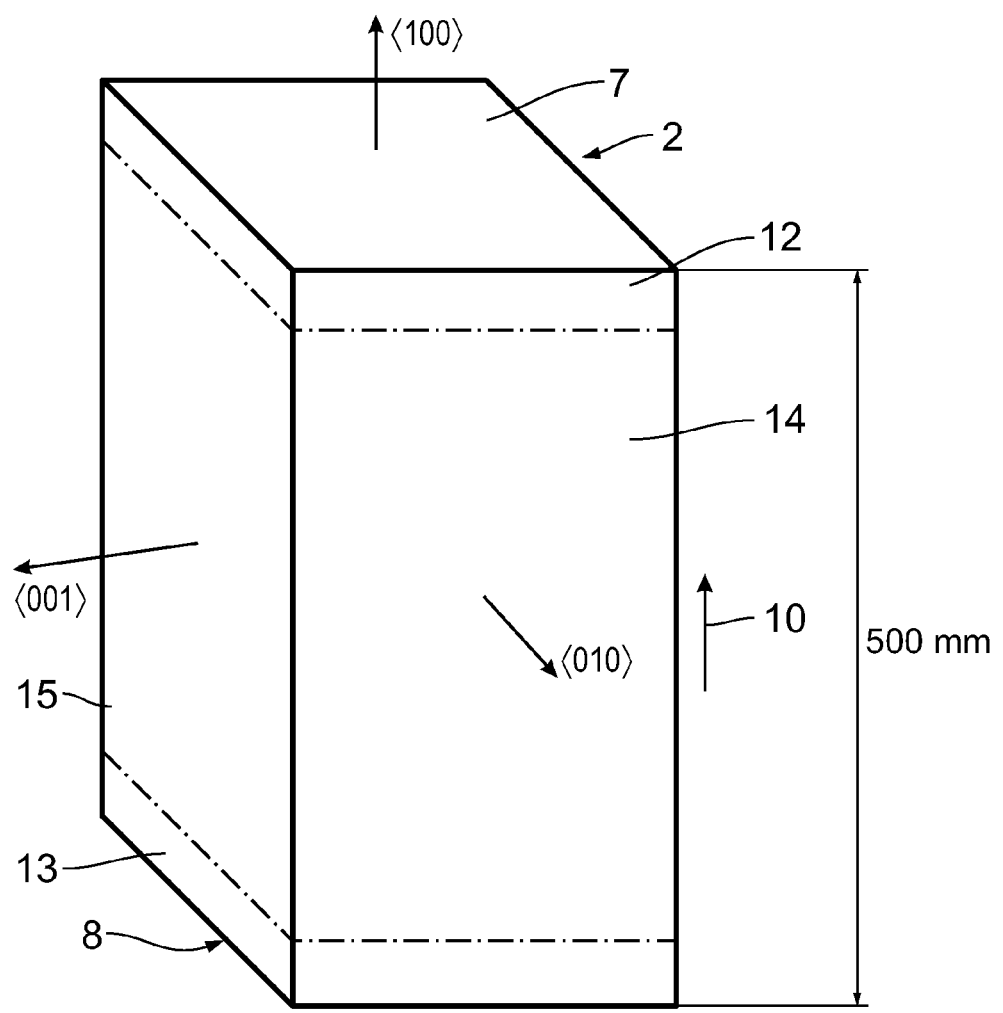
FIG. 2 shows schematically a silicon block produced with the apparatus according to FIG. 1.
Figure 4:
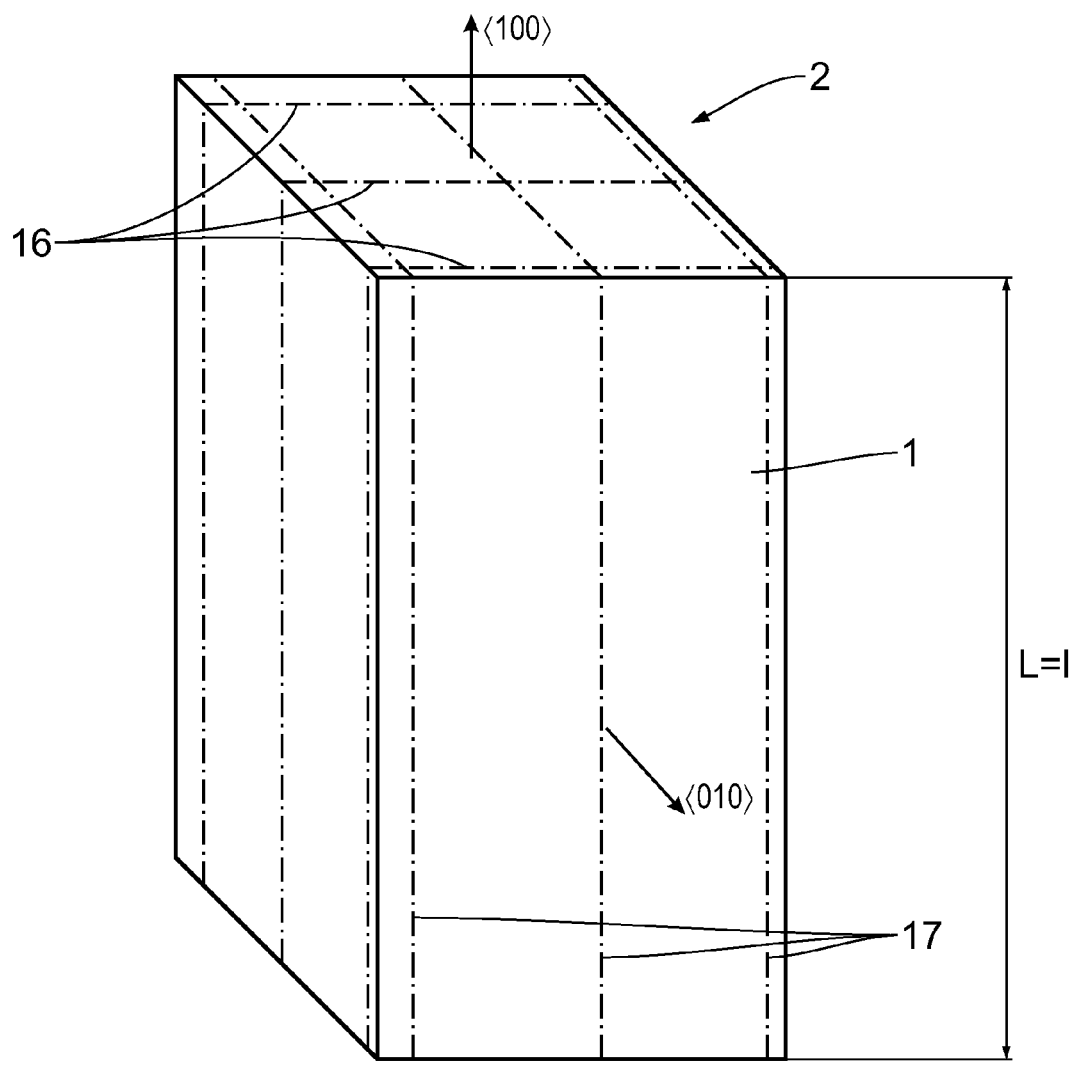
FIG. 4 shows schematically a cutting scheme for the cutting of the silicon block according to FIG. 2 into silicon ingots.
Figure 5:
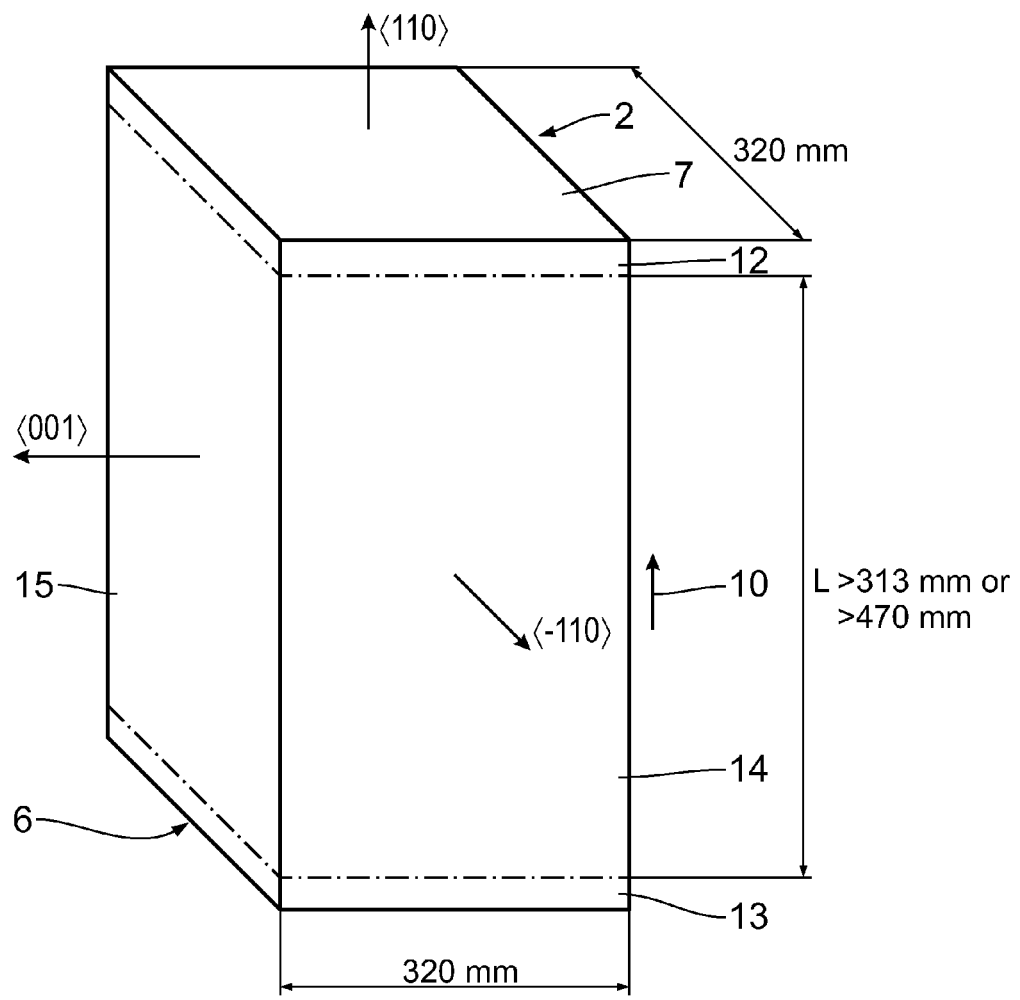
FIG. 5 shows a different embodiment of a silicon block.

According to the embodiment shown in FIGS. 2 and 4, the silicon block 2 has a square cross section 7. The cross section 7 measures 318 mm×318 mm.

As further indicated in FIG. 2 the silicon block 2 has side faces 14 and 15, which are parallel to the growth direction 10 and perpendicular to each other. The normal of the side face 14 has a <010>-orientation. The normal of the side face 15 has a <001>-orientation.

Figure 3:
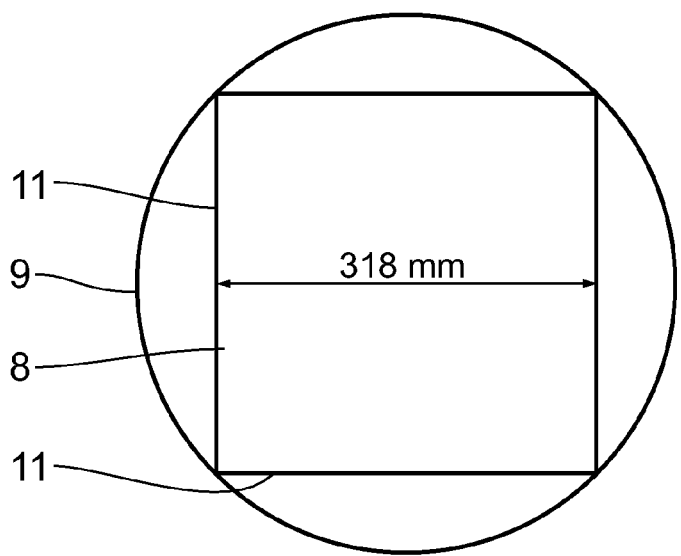
FIG. 3 shows schematically a seed crystal to be cut from a Czochralski ingot.

The silicon block 2 is grown from a seed crystal 8 shown in FIG. 3. The seed crystal 8 is produced from a Czochralski ingot 9 with a diameter of 450 mm. Fort that, the Czochralski ingot 9 is cut perpendicular to its longitudinal axis.

Starting from the seed crystal 8 the silicon block 2 is grown in a growth direction 10. The growth direction 10 is also referred to as longitudinal direction of the silicon block 2. The growth direction 10 is parallel to a <100>-orientation. This can be achieved by choosing the seed crystal 8, such that the normal of its surface is parallel to a <100>-orientation. Preferably, the cleavage direction is oriented at 45° to an edge 11 of the seed crystal 8.

Preferably, the seed crystal 8 is dislocation free.

Preferably, the seed crystal 8 is at a temperature, which is close to a melting temperature when the silicon melt 3 is brought into contact with its surface. Further, the seed crystal 8 is slightly melted on the seeding surface. Further, the growth process is controlled, such that the solid-liquid interface is basically flat.

In FIG. 2 a top area 12 and a bottom area 13 are schematically indicated. The bottom area 13 comprises the seed crystal 8. The top area 12 and/or the bottom area 13 can be cut away after the growth of the silicon block 2 has been completed, in particular after the silicon block 2 has cooled down to room temperature. By that, it can be ensured, that the silicon block 2 has homogeneous properties along its entire extension in the growth direction 10. In particular, it can be ensured, that the silicon block 2 has a constant dislocation density over its entire length L. The length L of the silicon block 2 can be around 200 mm. It can be at least 320 mm. It can also be as large as 64 cm, 80 cm, 96 cm or more.

As schematically shown in FIG. 4 the silicon block 2 is cut along cutting planes 16, 17. The cutting planes 16 are parallel to the side face 14. The cutting planes 16 are parallel to the side face 15 of the silicon block 2. The cutting planes 16 are perpendicular to the cutting planes 16. The cutting planes 16 are equidistant to each other. The cutting planes 17 are equidistant to each other.

Thus, the silicon block 2 is cut into a matrix of 2×2 silicon-ingots 1.

The silicon-ingots 1 have a length l corresponding to the length L of the silicon block 2. The silicon-ingots 1 have in particular a longitudinal direction parallel to a <100>-orientation. Thus, wafer with a cross section corresponding to the cross section of the silicon-ingots 1 and a normal of the wafer surface with a <100>-orientation can be cut from the silicon-ingots 1. For that, the silicon-ingot 1 is divided along planes perpendicular to its longitudinal direction.

According to the invention dislocation free silicon blocks 2 are grown according to the method described above. In order to facilitate a dislocation free growth of the silicon block 2, the seed assembly 6 comprises a single seed crystal 8. However, a seed assembly 6 made of a plurality of different dislocation free seed crystals 8 is also possible.

According to another embodiment schematically shown in FIGS. 5 to 10 the growth direction 10 of the silicon block 2 is parallel to a <110>-orientation. In this case the normal of the side face 14 is parallel to a <–110>-orientation. The normal of the side face 15 is parallel to a <001>-orientation.

Figure 6:
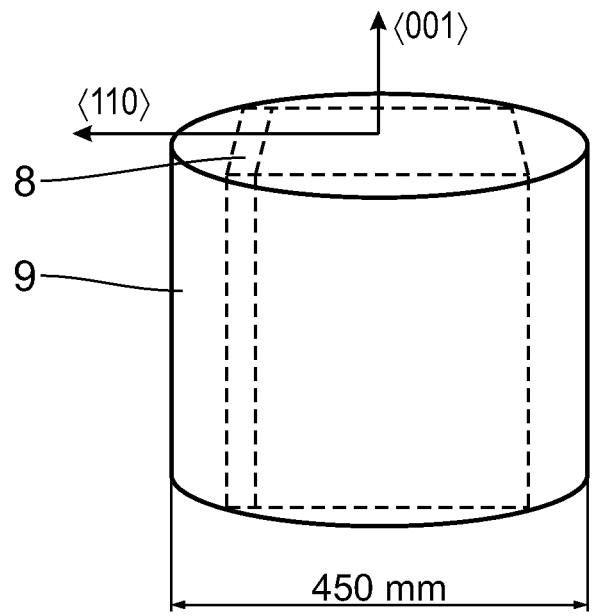
FIG. 6 shows schematically the cutting scheme to cut seeds from a Czochralski ingot in order to grow the silicon block shown in FIG. 5.
Figure 7:
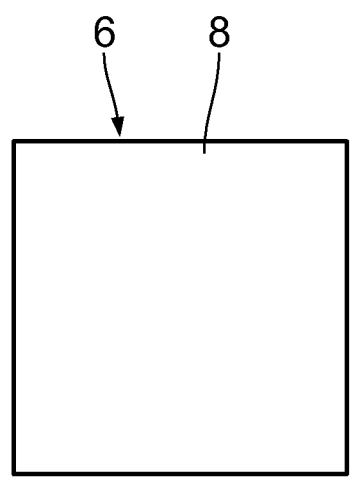
FIG. 7 shows the seed assembly comprising a single seed cut according to the cutting scheme shown in FIG. 6.
Figure 8:
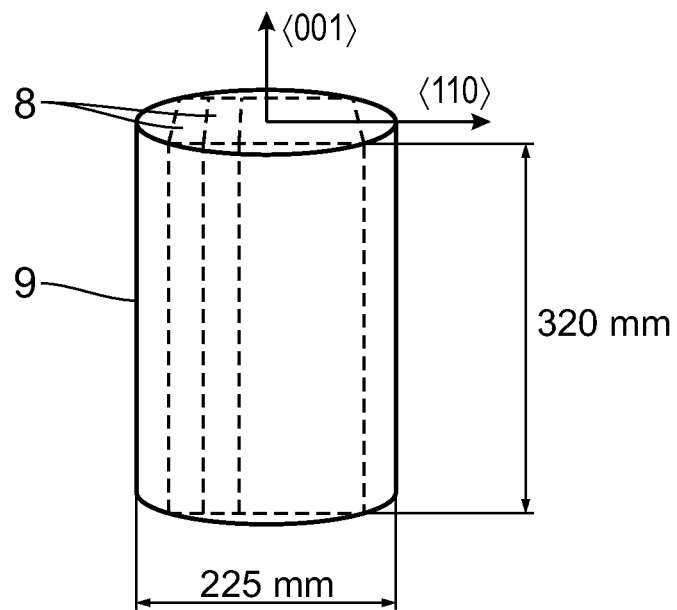
FIG. 8 shows a similar cutting scheme to FIG. 6 for cutting seeds from a different Czochralski ingot.
Figure 9:
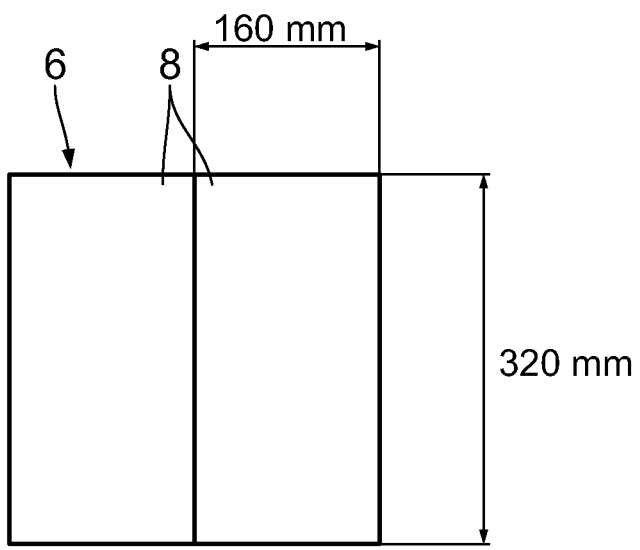
FIG. 9 shows a seed assembly comprising two seeds cut according to the cutting scheme shown in FIG. 8.

The silicon block 2 is grown from one of the seed assemblies 6 shown in FIG. 7 and FIG. 9, respectively. Whereas the seed assembly 6 shown in FIG. 7 comprises a single seed crystal 8, the seed assembly 6 shown in FIG. 9 comprises two seed crystals 8. All the seed crystals 8 according to this embodiment have a surface the normal of which is parallel to a <110>-orientation. The seed crystals 8 are cut from Czochralski ingots as shown in FIG. 6 and FIG. 8, respectively. In particular, the single seed crystal 8 according to FIG. 7 is cut from a Czochralski ingot with a diameter of 450 mm. In contrast, the seed crystals 8 according to FIG. 9 are cut from a Czochralski ingot with a diameter of 225 mm. The seed crystals 8 are cut by cutting a Czochralski ingot along planes parallel to a <001>-orientation, which is parallel to the growth direction and thus the longitudinal direction of the Czochralski ingots 9.

Whereas the seed crystal 8 according to FIG. 7 has a square shape with a side length of 320 mm, the seed crystals 8 according to FIG. 9 each have a rectangular shape with side length of 160 mm and 320 mm, respectively.

Again, the cross section 7 of the silicon block 2 is identical to the area of the seed assembly 6.

The silicon block 2 is grown to a length L, which preferably corresponds to an integer multiple of the desired side length of the cross section of the silicon-ingots 1 to be cut from the silicon block 2. In case of a desired side length of 156 mm, the length L of the silicon block 2 can be about 313 mm, 470 mm, 626 mm, 940 mm, or more.

Figure 10:
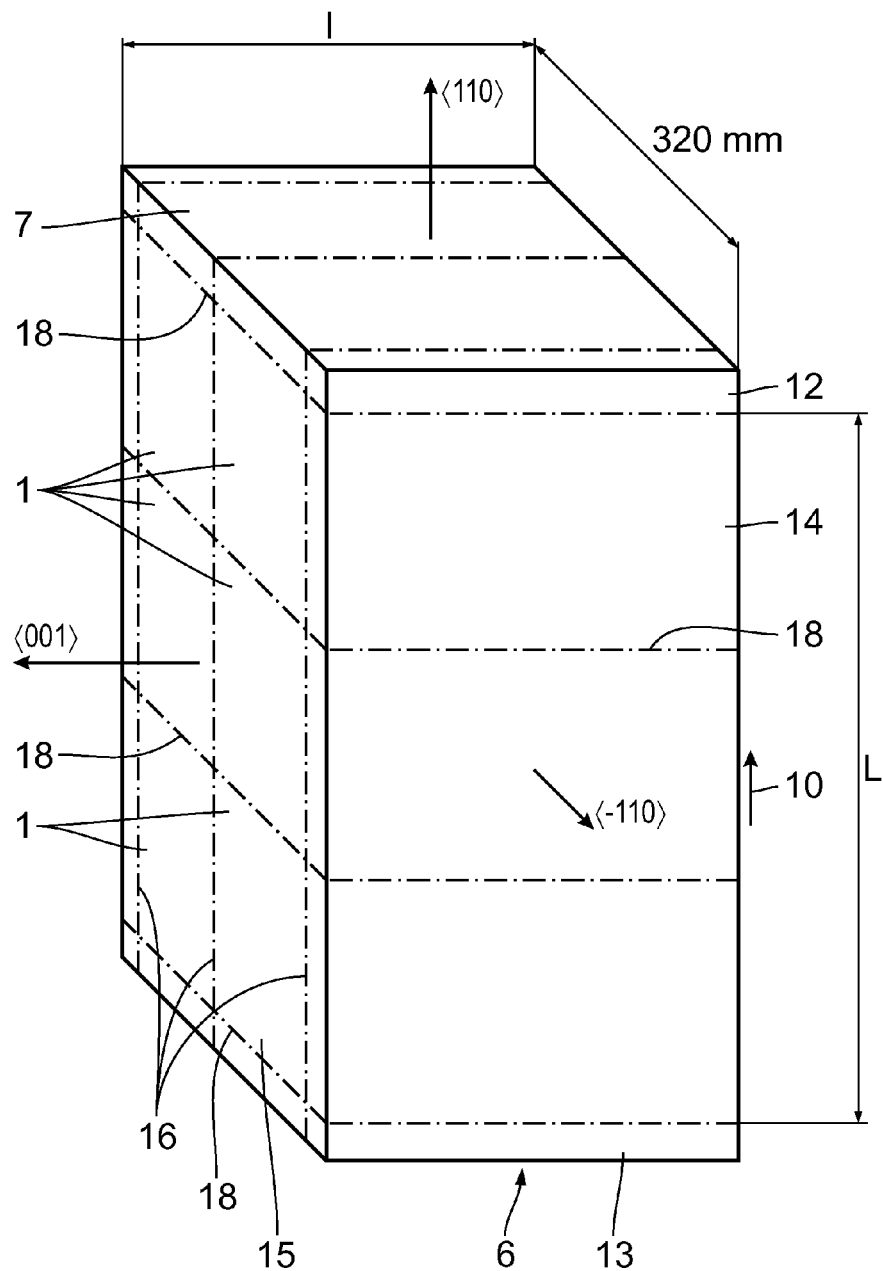
FIG. 10 shows a cutting scheme to cut ingots from the silicon block shown in FIG. 5, FIGS. 11 to 16 schematically show views corresponding o FIGS. 5 to 10, respectively of an alternative embodiment
Figure 11:
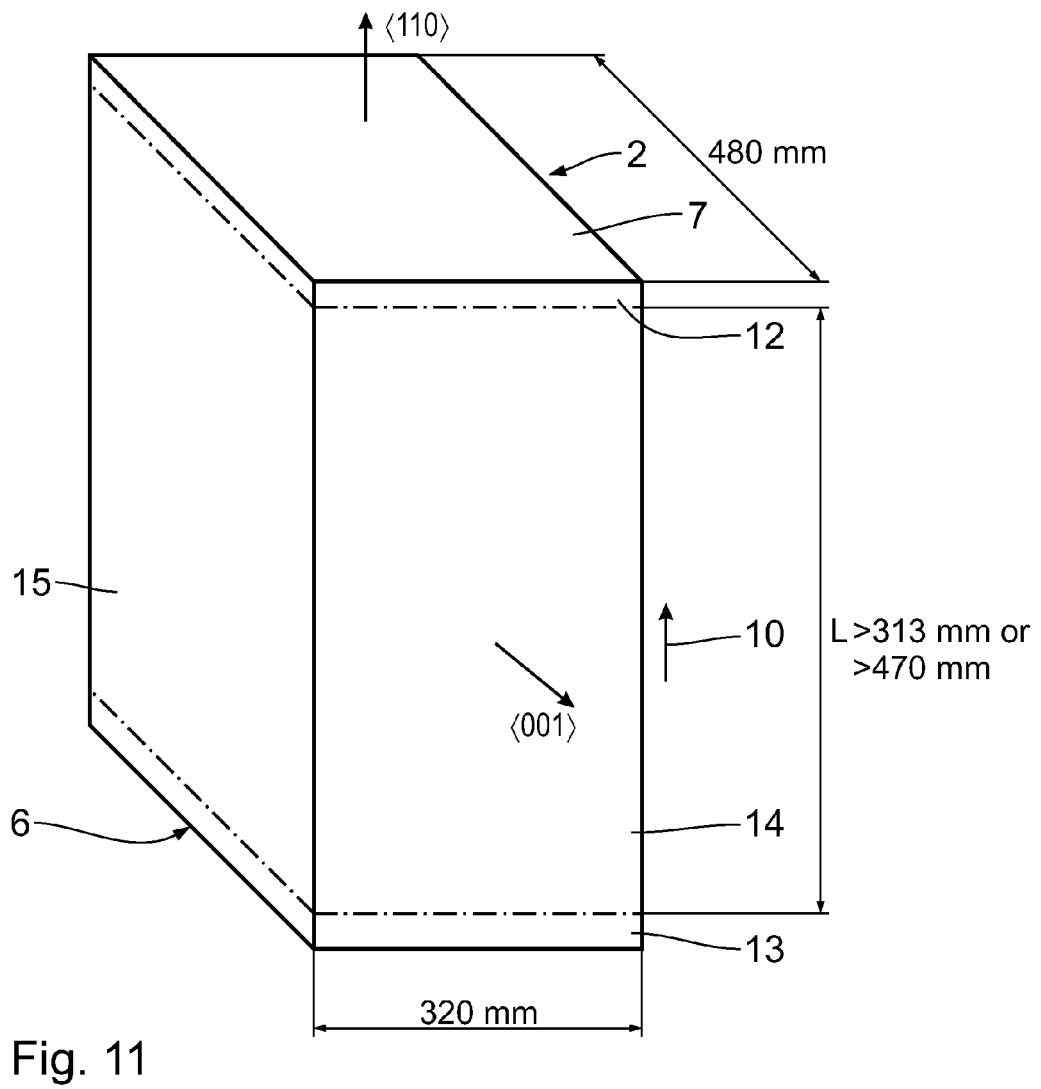
Figure 12:
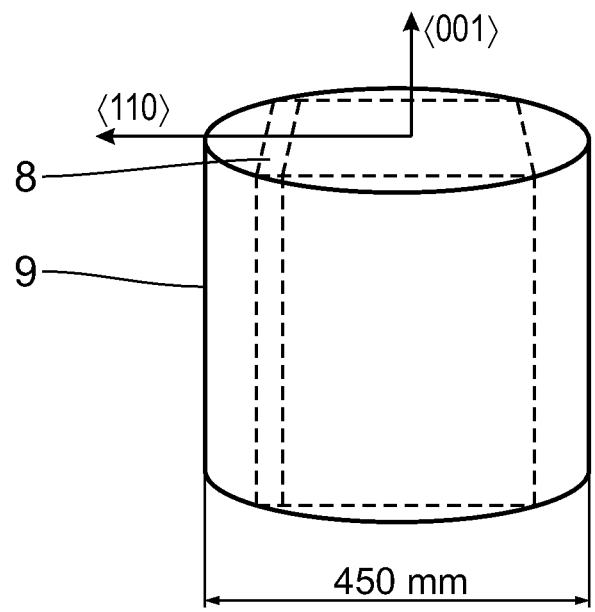
Figure 13:
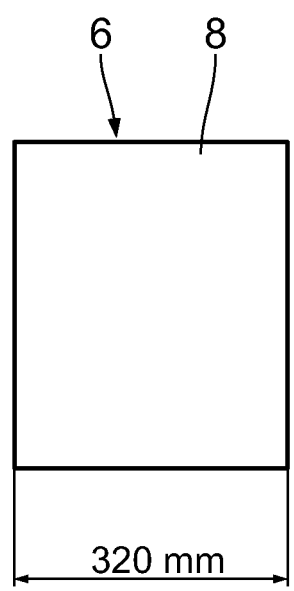
Figure 14:
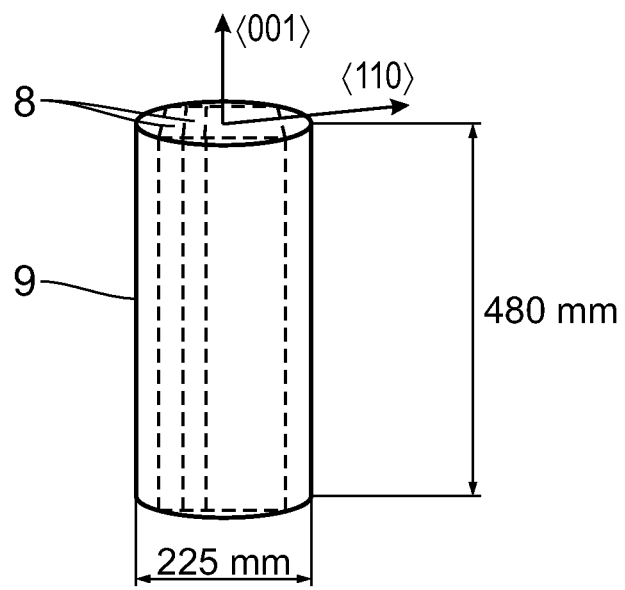
Figure 15:
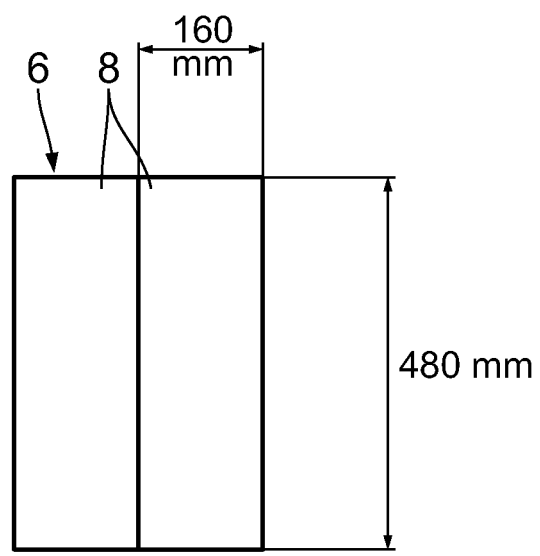
Figure 16:
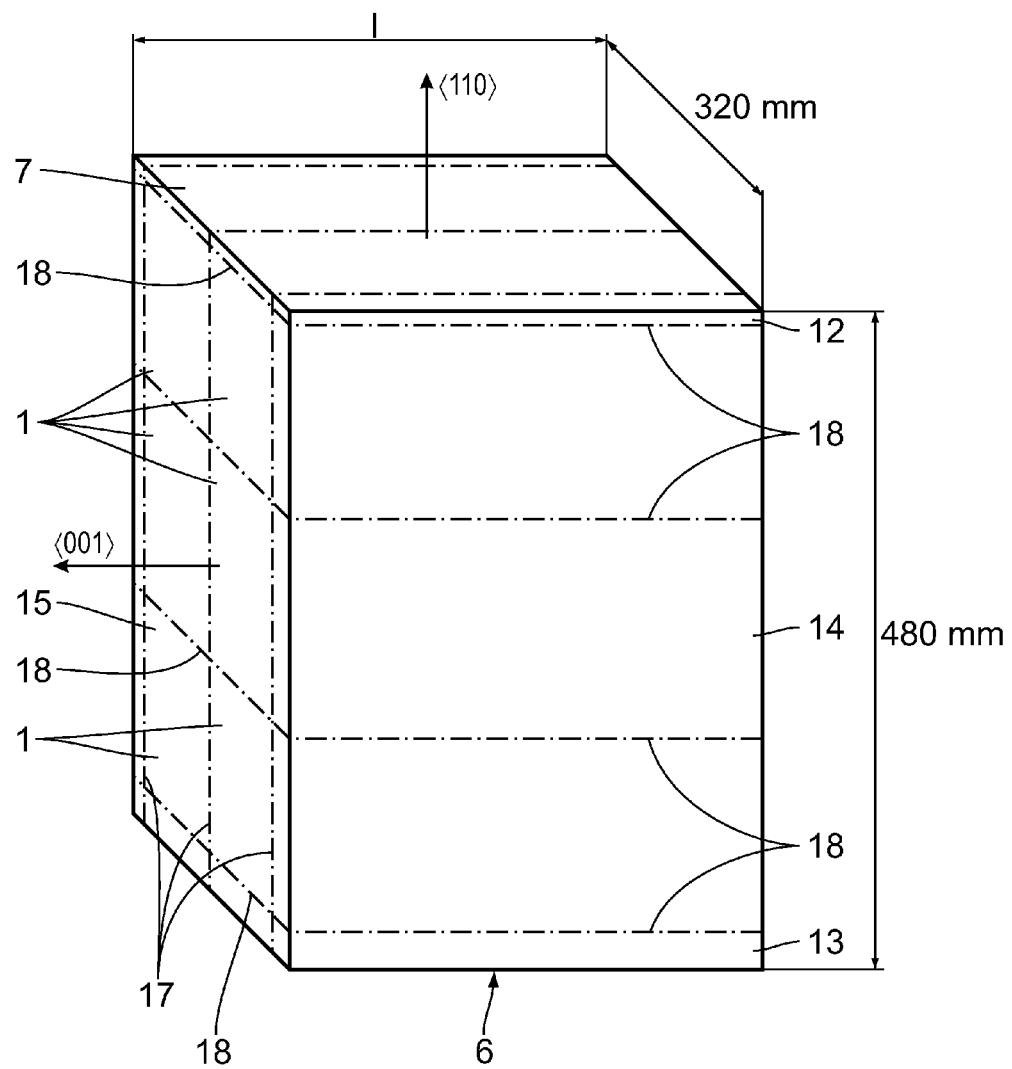
Figure 17:
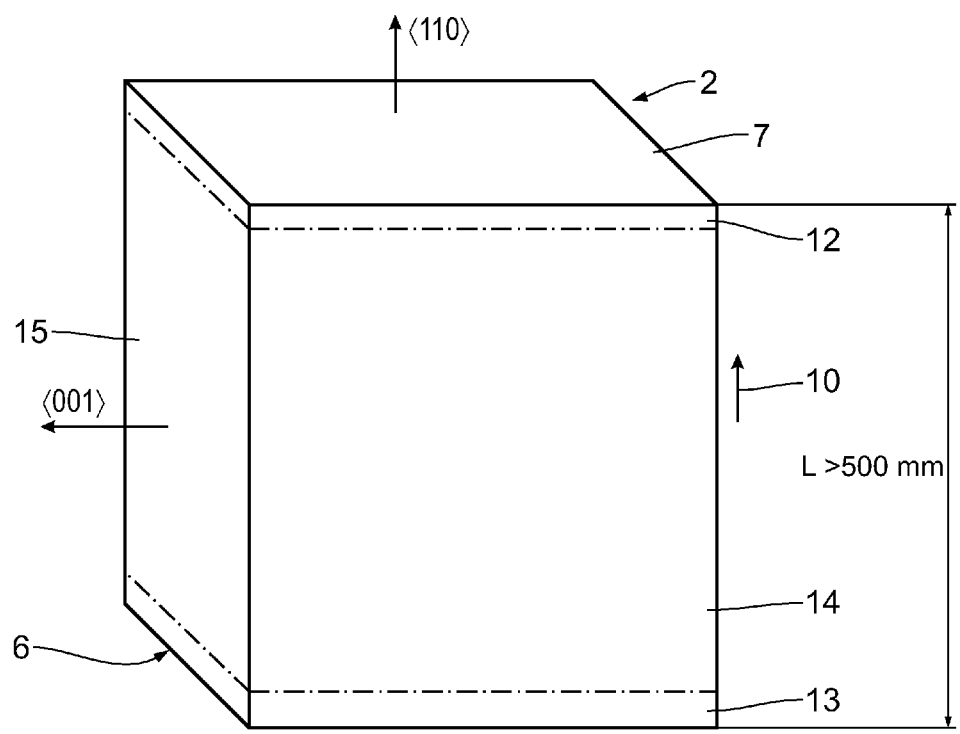
FIGS. 17 to 22 show corresponding views to yet another embodiment.
Figure 18:
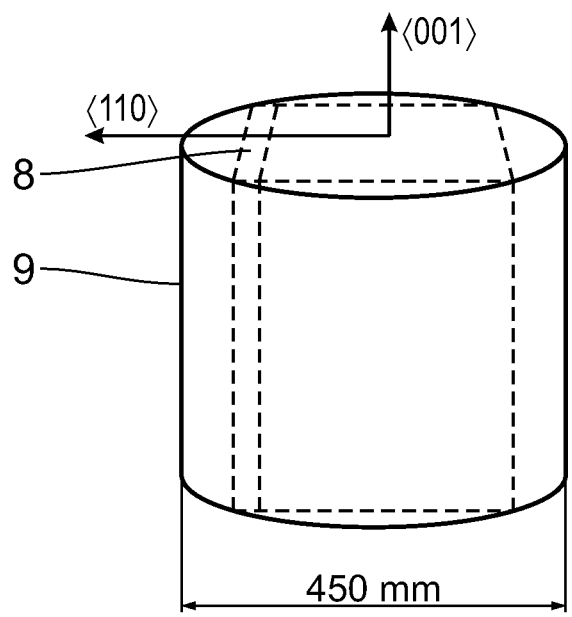

As shown schematically in FIG. 10, the silicon block 2 is cut into a 2×3 matrix of silicon-ingots 1. For other alternative references made to the description of the embodiment according to FIGS. 2 to 4.

In this embodiment the silicon block 2 is cut into silicon-ingots 1 by a number of first cutting planes 16 which are parallel to the side face 14 and second cutting planes 18, which are parallel to the cross section 7, i. e. perpendicular to the growth direction 10 of the silicon block 2.

As can be seen from FIG. 10, the silicon-ingots 1 have a length l of 320 mm.

By using a seed assembly 6 with dimensions of 320 mm×480 mm (cf. FIGS. 13 and 15) it is possible to produce silicon-ingots 1 with a length l of about 470 mm as shown in the embodiment according to FIGS. 11 to 16.

Such a seed assembly can be made from Czochralski ingots 9 with a length in longitudinal direction of 480 mm. Apart from that the embodiment according to FIG. 11 to FIG. 16 corresponds to the embodiment shown in FIGS. 5 to 10.

The cross section 7 of the silicon block 2 can be further increased by using yet larger seed assemblies 6 as for example shown in FIGS. 17 to 22.

Figure 19:
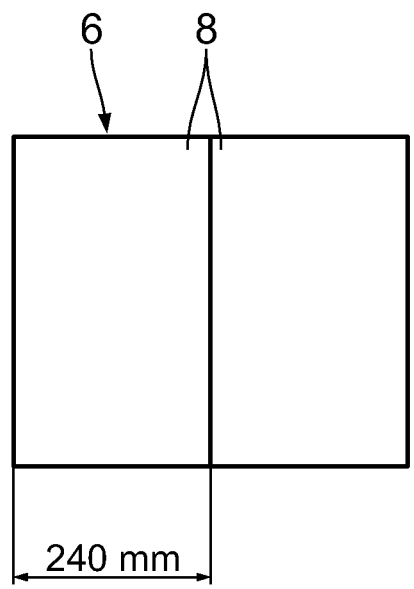
Figure 20:
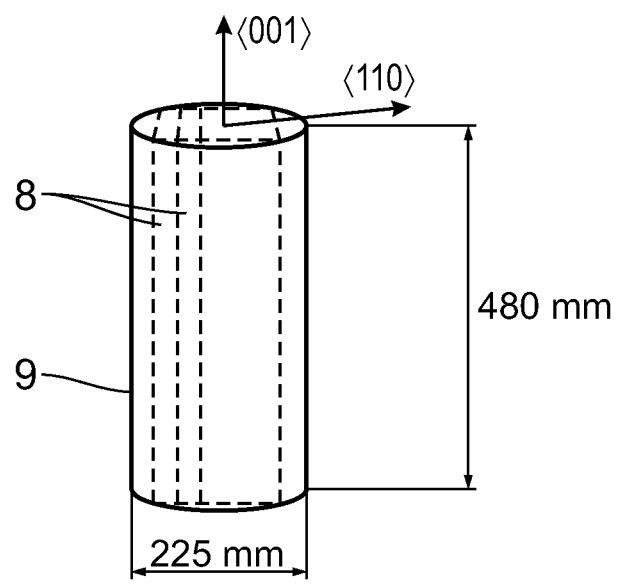

According to the embodiment shown in FIG. 19 the seed assembly 6 comprises two seed crystals 8 each with dimensions of 240 mm×480 mm.

Figure 21:
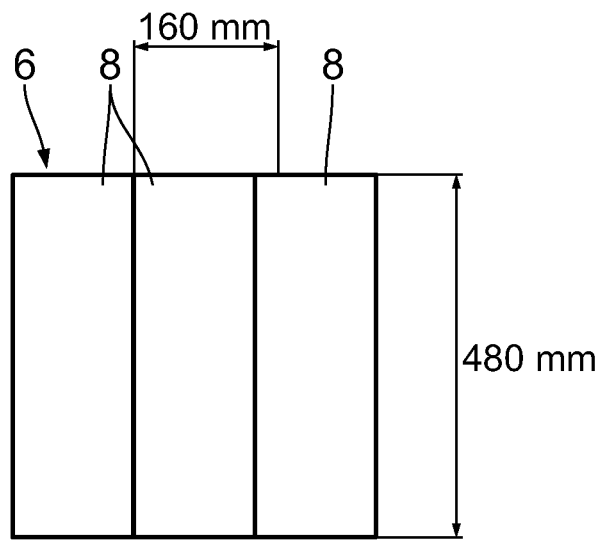
Figure 22:
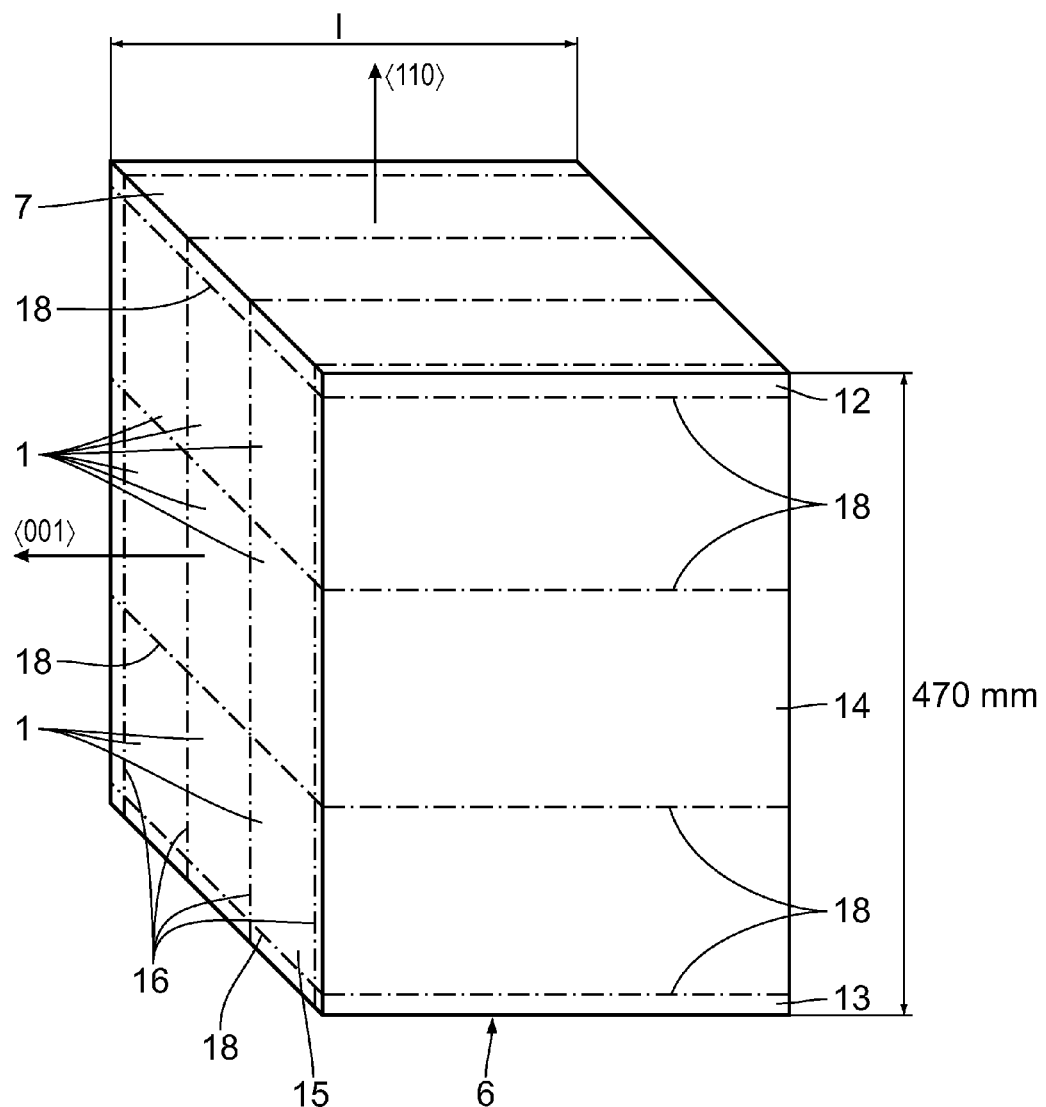

According to the embodiment shown in FIG. 21 the seed assembly 6 comprises three seed crystals 8, each with dimensions of 160 mm×480 mm.

Although in the figures the seed assembly 6 comprises arrangements of seed crystals 8, which, in at least one direction have a side length corresponding to the side length of the seed assembly 6, it is also possible, that the seed assembly 6 comprises a two dimensional arrangement of seed crystals 8. The seed assembly 6 can in particular comprise an arrangement of 2×2, 2×3, 2×4, 2×5, 2×6, 3×3, 3×4, 3×5, 3×6, 4×4, 4×5, 4×6, 5×5, 5×6, 6×6 or more seed crystals 8.

Further alternatives are also possible. In particular, whereas the seed assemblies 6 shown in the figures all comprise seed crystals 8 with identical shape, it is also possible to build a seed assembly 6 with seed crystals 8 of different sizes and/or shapes.

Furthermore, although the silicon-ingots 1 shown and described in the embodiments according to the Figs. all have a longitudinal direction which is parallel to a <100>-orientation, it is also possible to chose the cutting planes 16, 17, 18, such that the silicon-ingots 1 have a longitudinal direction parallel to a <111>-orientation or parallel to a different orientation.

With the method described above the throughput of the production of silicon-ingots 1 could be increased by more than 50%, in particular by more than 100%, in particular by more than 125% compared to previous methods.

The silicon of the block produced with the method according to the present invention can have an interstitial oxygen content of less than $5 \times 10^{16}$ atoms per $cm^3$. It can have a nitrogen content of less than $5 \times 10^{15}$ atoms per $cm^3$. This includes single nitrogen atoms, nitrogen dimers N—N and triplets out of two nitrogen atoms and one oxygen atom N—N—O. Silicon ingots cut from these blocks and wafers cut therefrom have according features.

The invention claimed is:

1. A method for producing silicon-ingots comprising the following steps:
   providing a silicon melt;
   growing a block of silicon from said silicon melt, said block having a predetermined crystal orientation; and
   cutting said block along at least one cutting plane into a number of silicon-ingots, wherein for the growing of said block of silicon a crucible-less process is used, wherein said block is cut, such that said silicon-ingots have a longitudinal direction which is perpendicular to a growth direction of said block.

2. Method according to claim 1, wherein for the growing of said block of silicon the growth direction is chosen to be parallel to one of the following directions: <100>, <110> and <111>.

3. Method according to claim 1, wherein for the growing of said block of silicon a seed assembly comprising at least one seed is used.

4. Method according to claim 1, wherein said at least one seed is made from monocrystalline silicon.

5. Method according to claim 1, wherein said block has a length in the growth-direction of at least 313 mm.

6. Method according to claim 1, wherein said block has a rectangular cross section.

7. Method according to claim 5, wherein said block has a crystal-structure and side faces the normal of which are oriented parallel to one of the following directions: <100>, <110> and <111>.

8. Method according to claim 1, wherein said silicon-ingots have a square cross-section.

9. Method according to claim 1, wherein said block is cut into a matrix of silicon-ingots, wherein each side of the matrix corresponds to at least two silicon-ingots.

10. A method for producing silicon-ingots comprising the following steps:
providing a silicon melt;
growing a block of silicon from said silicon melt via a crucible-less process, said block comprising a predetermined crystal orientation; and
dividing said block along at least one cutting plane into a number of silicon-ingots such that said silicon-ingots have a longitudinal direction perpendicular to a growth direction of said block.

11. Method according to claim 10, wherein for the growing of said block of silicon the growth direction is chosen to be parallel to one of the following directions: <100>, <110> and <111>.

12. Method according to claim 10, wherein said block has a length in the growth-direction of at least 313 mm.

13. Method according to claim 10, wherein said silicon-ingots have a square cross-section.

14. Method according to claim 10, wherein said block is cut into a matrix of silicon-ingots, wherein each side of the matrix corresponds to at least two silicon-ingots.

15. Method according to claim 12, wherein said block has a crystal-structure and side faces the normal of which are oriented parallel to one of the following directions: <100>, <110> and <111>.

16. A method for producing silicon-ingots comprising the following steps:
providing a silicon melt;
forming a block of silicon from said silicon melt via a process without using a crucible, said block having a predetermined crystal orientation; and
cutting said block along at least one cutting plane into a number of silicon-ingots such that said silicon-ingots have a longitudinal direction that is perpendicular to a growth direction of said block.

17. Method according to claim 16, wherein for the growing of said block of silicon the growth direction is chosen to be parallel to one of the following directions: <100>, <110> and <111>.

18. Method according to claim 16, wherein said block has a length in the growth-direction of at least 313 mm, wherein said block has a crystal-structure and side faces the normal of which are oriented parallel to one of the following directions: <100>, <110> and <111>.

19. Method according to claim 16, wherein said silicon-ingots have a square cross-section.

20. Method according to claim 16, wherein said block is cut into a matrix of silicon-ingots, wherein each side of the matrix corresponds to at least two silicon-ingots.

* * * * *